US005396235A

United States Patent [19]

Maeshima et al.

[11] Patent Number: 5,396,235

[45] Date of Patent: Mar. 7, 1995

[54] NUMERAL SETTING APPARATUS

[75] Inventors: Katsuyoshi Maeshima, Yokohama; Masayuki Ogusu, Kawasaki, both of Japan

[73] Assignee: Canon Kabushiki Kaisha, Tokyo, Japan

[21] Appl. No.: 996,872

[22] Filed: Dec. 21, 1992

Related U.S. Application Data

[63] Continuation of Ser. No. 755,574, Sep. 5, 1991, abandoned.

[30] Foreign Application Priority Data

Sep. 5, 1990 [JP] Japan ................................ 2-235053
Oct. 26, 1990 [JP] Japan ................................ 2-287146

[51] Int. Cl.[6] ...................... G03G 21/00; H03K 25/00

[52] U.S. Cl. ...................................... 341/34; 355/209; 355/243; 327/516

[58] Field of Search .................. 355/243, 209; 341/34; 340/706; 84/DIG. 7; 377/94; 307/308; 177/25.13, 25.17; 364/736

[56] References Cited

U.S. PATENT DOCUMENTS

| | | | |
|---|---|---|---|
| 4,033,219 | 7/1977 | Deutsch | 84/1.03 |
| 4,160,400 | 7/1979 | Schrecongost | 84/DIG. 7 |
| 4,257,305 | 3/1981 | Friend et al. | 84/DIG. 7 X |
| 4,313,113 | 1/1982 | Thornburg | 341/34 X |
| 4,323,888 | 4/1982 | Cole | 340/365 A |
| 4,673,919 | 6/1987 | Kataoka | 341/34 X |
| 4,699,038 | 10/1987 | Wedge | 84/DIG. 7 X |
| 4,857,887 | 8/1989 | Iten | 341/34 |
| 4,975,734 | 12/1990 | Mishima | 355/209 |
| 4,979,423 | 12/1990 | Watanabe | 84/DIG. 7 X |

FOREIGN PATENT DOCUMENTS

| | | |
|---|---|---|
| 58-76931 | 5/1983 | Japan . |
| 59-9746 | 1/1984 | Japan . |
| 63-292217 | 11/1988 | Japan . |

*Primary Examiner*—A. T. Grimley
*Assistant Examiner*—Nestor R. Ramirez
*Attorney, Agent, or Firm*—Fitzpatrick, Cella, Harper & Scinto

[57] ABSTRACT

A numeral setting apparatus for setting numerals such as copy magnification, copy density, or the like includes an operating member such as up/down keys or a volume lever and a setting device to set numerals corresponding to a magnitude of force which is applied to the operating member. When a larger force is applied to the operating member, the setting device changes the numerals in larger increments than those in the case where a smaller force is applied.

13 Claims, 8 Drawing Sheets

NUMERAL SETTING APPARATUS

This application is a continuation of application Ser. No. 07/755,574, filed Sep. 5, 1991, now abandoned.

BACKGROUND OF THE INVENTION

1. Field of the Invention

The invention relates to a numeral setting apparatus for setting numerals such as a copy magnification and the like.

2. Related Background Art

Hitherto, in various kinds of electronic apparatuses, an operating system having various constructions is used to input various control data.

In the case of inputting quantity or numeric data, there is a method whereby a potentiometer is operated by a lever, a volume knob, or the like. In recent years, since a microprocessor or the like is used as a controller to control the apparatus, there is frequently used a method whereby numerals are directly input by using a ten-key, a method whereby up/down keys are used and an input numeral is continuously increased or decreased for a period of time when the up or down key is depressed, or the like.

The method of directly inputting numerals by using the ten-key or the method using the up/down keys is also used, for instance, to set a magnification, a number of copies, a density, or the like in a copying apparatus which can perform a zooming operation.

The method using the ten-key or the up/down keys has an advantage such that construction is simple and the apparatus is cheap because there is no need to use a lever, an A/D converting process, and the like in a control system of a microprocessor or the like.

In the conventional apparatus, however, in the case of deciding a numeral by using the up/down keys, there are the following drawbacks. The operation system of the copying apparatus will now be described as an example hereinbelow.

Although a copy magnification variable range differs depending on a copying apparatus, there is a tendency such that a variable range becomes wider at present in many copying apparatuses. For instance, there is a copying apparatus having a variable range from 50 to 400% in which the magnification can be set on a 1% unit basis.

In the case-of the apparatus of the type such that the magnification is changed by 1% each time the up/down key is depressed once, the up/down key must be depressed many times to set a desired magnification.

In the case of the type such that the magnification is continuously changed by continuously depressing the up/down key, the magnification must be slowly changed to accurately set a desired magnification because there are 350 kinds of magnifications.

In the case of slowly changing the magnification, however, it takes a very long time and operating efficiency is bad. For instance, assuming that the magnification has been changed by 0.5 second per data, it takes about three minutes to completely change the magnification, so that such a method is not practical.

On the other hand, in the case of the type such that a changing speed of the magnification is increased by about ten times to thereby quickly set a desired magnification when the up/down key is continuously depressed for a few seconds, the changing speed is so fast that it is difficult to stop the depression of the up/down key at a position corresponding to the desired magnification. There is a situation such that the magnification exceeds the desired magnification and the magnification must be often returned to the desired magnification by operating the up/down key in the opposite direction. Thus, there is a drawback such that it is troublesome to accurately set the desired magnification.

The above problems also similarly occur in the application fields such that the number of copies, an area to perform an edition, and a density in a copying apparatus are set or that the up/down keys are operated in a service mode to input operating condition data of a machine main body, and the like. Even in apparatuses other than the copying apparatus, the apparatus using an interface by using the similar up/down keys has problems similar to those mentioned above.

SUMMARY OF THE INVENTION

It is an object of the invention to improve the operability of a numeral setting apparatus or an image forming apparatus.

Another object of the invention is to provide a numeral setting apparatus or an image forming apparatus which can accurately set numerals at a high speed.

Still another object of the invention is to provide a numeral setting apparatus or an image forming apparatus having an operation switch for generating a signal according to a depression force in the direction perpendicular to an operation panel.

The above and other objects and features of the present invention will become apparent from the following detailed description and the appended claims with reference to the accompanying drawings.

DETAILED DESCRIPTION OF THE PREFERRED EMBODIMENTS

An embodiment according to the invention will be described hereinbelow with reference to the drawings.

Figure 1:
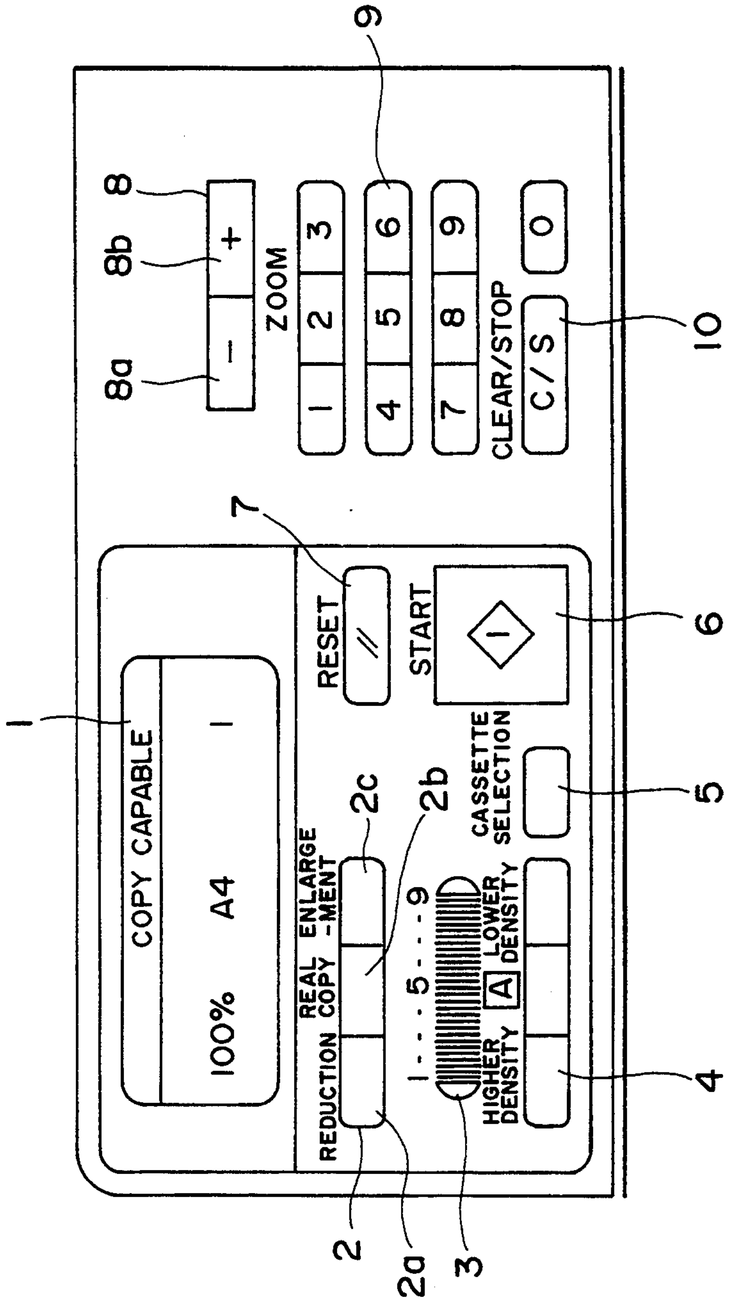
FIG. 1 is a partial front view of an operation panel of a copying apparatus of an embodiment to which the invention has been applied.
Figure 2:
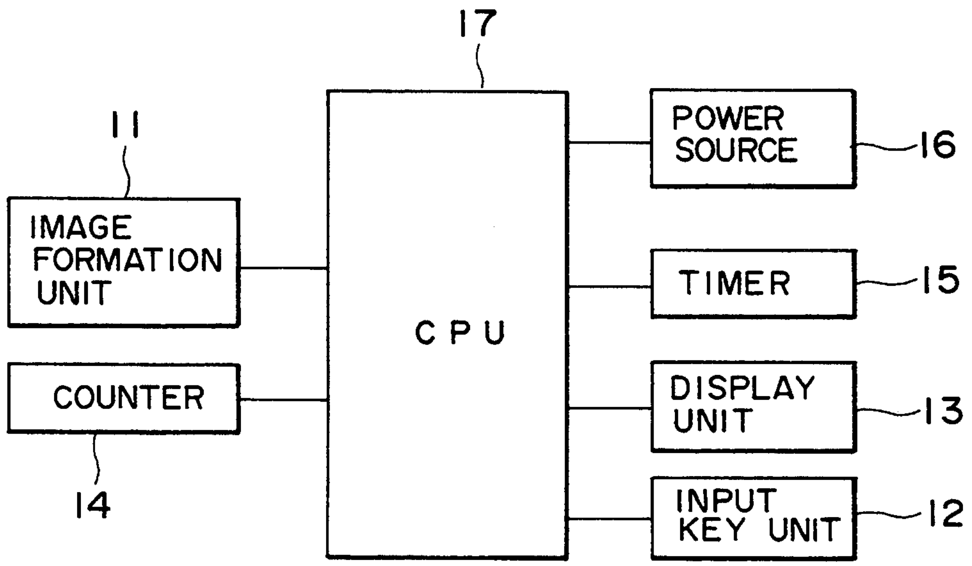
FIG. 2 is a block diagram showing a construction of the copying apparatus of the embodiment according to the invention.
Figure 3:
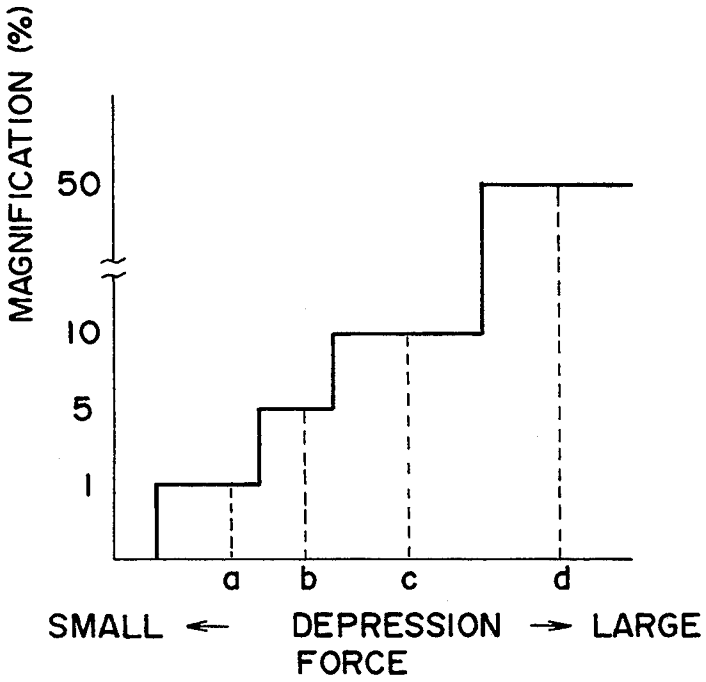
FIG. 3 is a correspondence diagram between a depression force of a variable magnification key and a changing magnification in the copying apparatus of the embodiment according to the invention.

FIG. 1 is a partial front view of an operation panel of a copying apparatus of an embodiment according to the invention. FIG. 2 is a block diagram showing a construction of the apparatus of FIG. 1. FIG. 3 is a diagram showing the relation between a depression force of a variable magnification key and a changing magnification.

In FIG. 1, reference numeral 1 denotes a liquid crystal display unit which displays a magnification, a cassette size, and a registered number as copying conditions and also displays whether the apparatus is in a copy mode or a standby mode. Reference numeral 2 denotes a fixed magnification key; 2*a* a reduction key; 2*b* a real copy key; 2*c* an enlargement key; 3 a density display unit comprising an LED (light emitting diode) display device to display a density within a range from a higher density (dark) to a lower density (light); 4 a density key by which a copy density can be set; 5 a cassette selection key to select a size of copy sheet; 6 a start key; 7 a reset key to return the set state to a standard state; and 8 a zoom key comprising a (−) key 8*a* to reduce a magnification and a (+) key 8*b* to increase the magnification. The zoom key 8 is constructed by piezoelectric sensors in each of which an output signal changes in proportion to a depression force of the corresponding key 8*a* or 8*b*. Reference numeral 9 denotes a ten-key and 10 indicates a clear/stop key which is used to change only the registered number or to interrupt the copying operation.

In FIG. 2, reference numeral 11 denotes an image formation unit to form a latent image on the basis of the reflected lights from an original and to form an image onto a copy transfer material through processes such as development, copy transfer, and fixing. Reference numeral 12 denotes an input key unit for setting the copying conditions as described in FIG. 1 or for giving an operation instruction; 13 a display unit to display the above set values and the operating state; 14 a counter to count the number of copies; 15 a timer to set a time; 16 a power source; and 17 a central processing unit (CPU) to integratedly control the above components.

In the case of setting a copy magnification, particularly, in the case of setting a fixed magnification, it is set by depressing the fixed magnification key 2*a*, 2*b*, or 2*c*. In the case of setting an arbitrary magnification, it is set by depressing either the zoom key 8*a* or 8*b*. The zoom key 8 is constructed by the piezoelectric sensors as mentioned above. A changing magnification differs in dependence on a depression force. FIG. 3 shows the relation between the depression force and the changing magnification. For instance, there are the relations of $a<b<c<d$ among depression forces a, b, c, and d. When the button is depressed by the depression force of a, the magnification advances by one stage at a time. When the button is depressed by the depression force of b, the magnification advances by five stages at a time. Similarly, the magnification advances by 10 stages at a time for the depression force c and by 50 stages for the depression force of d. In this manner, the magnification largely changes by depressing the button by a strong force. The table shown in FIG. 3 has been stored in a memory in the CPU 17.

To set the magnification of 150% from the real scale magnification (100%), it is sufficient to once depress the key 8*b* by a depression force near d. To set 78%, the key 8*a* is depressed twice by a depression force near c and the key 8*a* is further depressed twice by a depression force near a. The CPU 17 changes the set magnification with reference to the table shown in FIG. 3 on the basis of an output of the zoom key 8.

In the case of setting an arbitrary magnification, therefore, the number of depression times of the zoom key is small and the magnification changes in accordance with the depression force, so that operability which is excellent in terms of human engineering is obtained and an erroneous setting or the like can be reduced.

Figure 4:
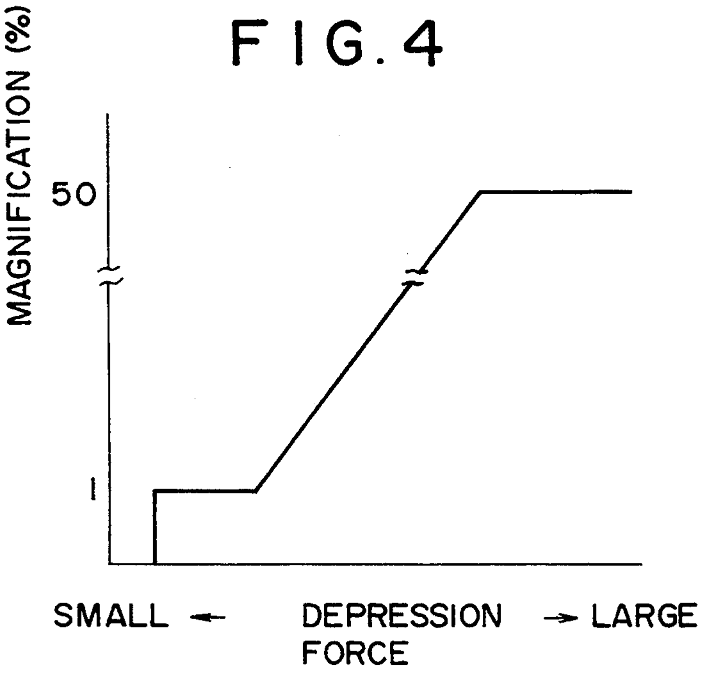
FIG. 4 is a correspondence diagram between a depression force of a variable magnification key and a changing magnification of a copying apparatus in another embodiment to which the invention has been applied.

In the relation between the depression force and the changing magnification, the number of stages of the magnification is not limited to four stages of 1%, 5%, 10%, and 50% as shown in FIG. 3 but the magnification can be also continuously set as shown in FIG. 4.

For 1% which is considered to be frequently used, a certain width of the depression force is provided as shown in FIG. 4, thereby improving the operability.

That is, an output signal from the piezoelectric sensor is converted into a digital signal. The CPU 17 table converts the received digital signal by using the internal memory having the table as shown in FIG. 4 and changes the magnification in accordance with a conversion output. The conventional variable magnifying mechanism (the mechanism such that the magnification is sequentially changed by continuously depressing a key or the mechanism such that a changing speed of the magnification varies when the key is continuously depressed or the like) can be also combined to the zoom key such that the changing magnification changes in accordance with the depression force as mentioned above.

Another embodiment of the invention will now be described in detail hereinbelow with reference to the drawings. A copying apparatus will now be described as an embodiment hereinafter.

Figure 5:
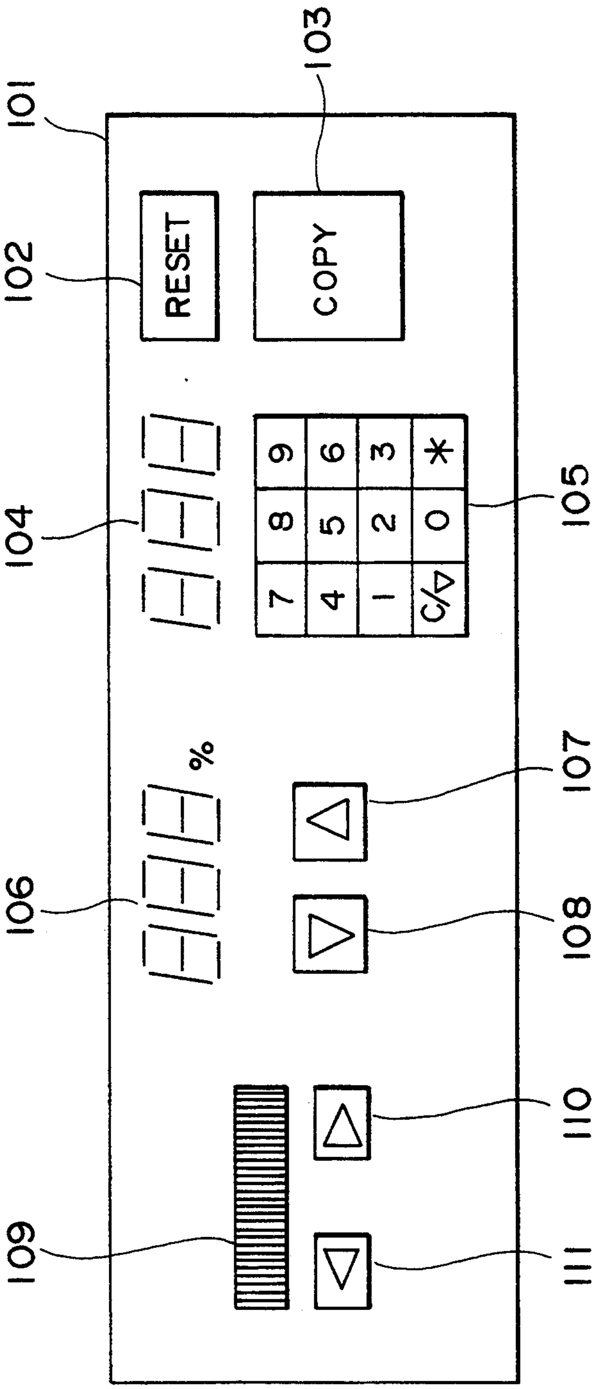
FIG. 5 is an explanatory diagram of an operation unit of an electronic apparatus to which the invention has been applied.
Figure 6:
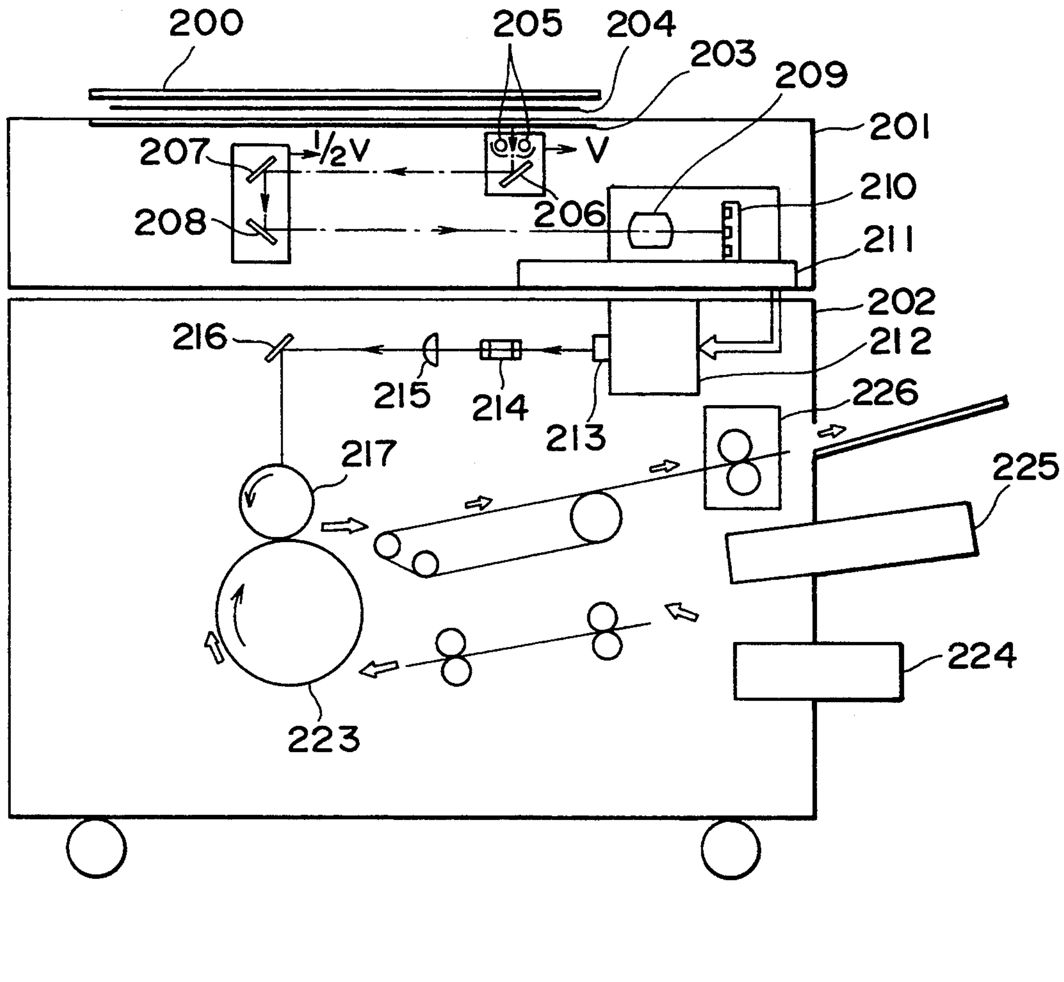
FIG. 6 is an explanatory diagram showing a structure of the whole apparatus of FIG. 5.

FIGS. 5 and 6 show a construction of a copying apparatus according to another embodiment of the invention. In FIG. 5, reference numeral 101 denotes an operation unit of the copying apparatus; 102 a reset key to initialize all of the set modes; 103 a copy start key to start the copying operation; and 104 an LED to display the number of copies.

Reference numeral 105 denotes a ten-key to set the number of copies; 106 an LED to display a copy magnification; 107 a key (up key) to increase the copy magnification; 108 a key (down key) to reduce the copy magnification; 109 an LED to display the copy density; 110 a key (up key) to increase the copy density; and 111 a key (down key) to reduce the copy density.

FIG. 6 shows a main body of the copying apparatus. In the diagram, reference numeral 201 denotes an image scanner as an image reading unit; 202 a printer as an image formation unit; 203 an original base glass; 204 an original; 205 an original illuminating lamp; 206 a first mirror; 207 a second mirror; 208 a third mirror; and 209 a lens to form an image.

Reference numeral 210 denotes a CCD to read an image; 211 an image processing circuit and a sequence controller; 213 a laser to expose an image; 214 a polygon mirror to scan the laser; 215 a laser correction optical system; 216 a fold-over mirror; 217 a photo-sensitive drum to form an image; 224 and 225 sheet cassettes from which copy sheets are picked up one by one and are fed into the apparatus; and 226 a fixing device to fix the image on the copy sheet.

The fundamental copying operation in the above structure will now be described.

The desired number of copies is input by the ten-key 105 of the operation unit 101. A desired variable magnification is determined by using the keys 107 and 108. A density is decided by using the keys 110 and 111 in accordance with a density of the original. A construction for the control by the up/down keys 107, 108, 110, and 111 will be explained herein later.

After the copying conditions were decided, the original 204 is put onto the original base glass 203, an original pressing plate 200 is closed, and the copy start key 103 is depressed. By depressing the copy key 103, the copying apparatus starts the copy sequence.

The optical systems 205 and 206 scan the original 204 and an-image is formed onto the CCD 210 by the lens 209. The CCD 210 photoelectrically converts the optical image formed thereon into the electric image signal. The image processing circuit 211 processes the image signal in accordance with the magnification which has been set by the operation unit and with the set density. The signal converted into the desired image signal is sent to the printer 202 and is photoelectrically converted by the laser 213 and is recorded onto the photosensitive drum 217. The copy sheet fed from either one of the cassettes 224 and 225 is conveyed through a sheet conveying unit and the image formed on the drum 217 is copy transferred onto the sheet. The image on the sheet is fixed by the fixing device 226 and the sheet is discharged out of the apparatus after that.

Figure 7:
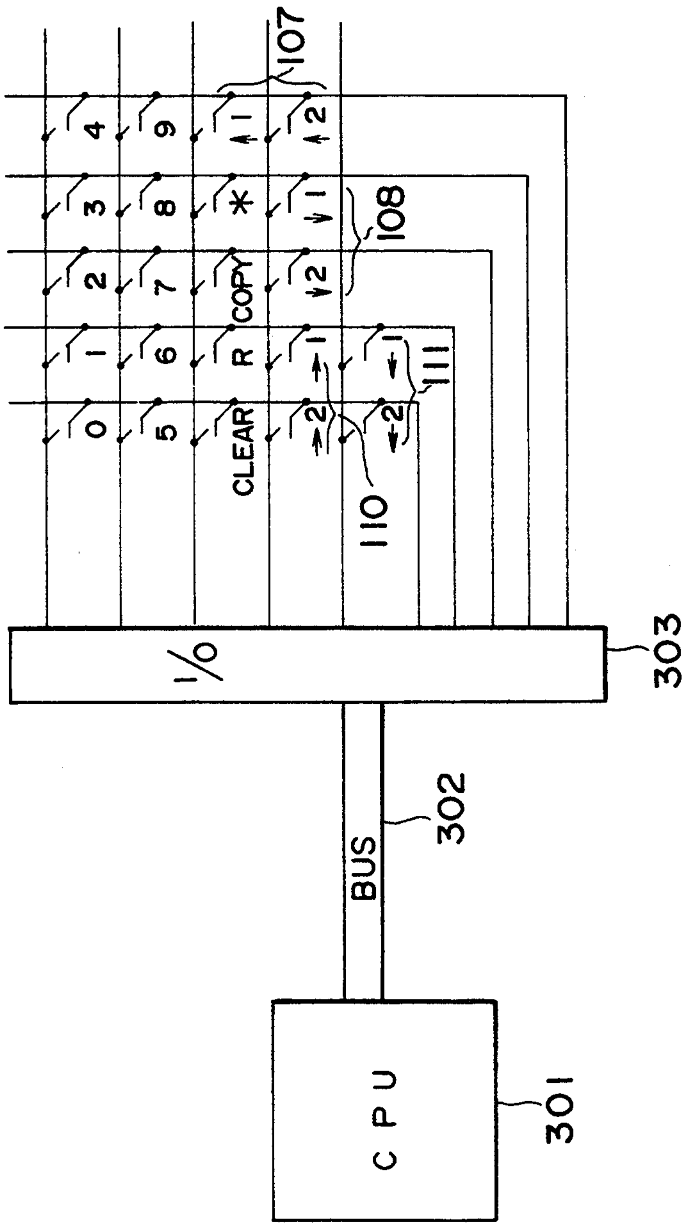
FIG. 7 is a block diagram of an input control unit for the operation unit in FIG. 5.

FIG. 7 shows a key input unit of the operation unit. In FIG. 7, reference numeral 301 denotes a CPU comprising a microprocessor or the like. The CPU 301 constructs an input control unit. The CPU 301 can be also commonly used as a main control unit of the whole apparatus.

A bus 302 of the CPU 301 is connected to a key matrix through an I/O port 303. The I/O port 303 is provided to detect the depression of each key of the operation unit in FIG. 5. Each of the up/down keys 107, 108, 110, and 111 among the keys of the operation unit has two contacts shown by (↑1, ↑2), (↓1, ↓2), (→1, →2), or (←1, ←2) in FIG. 7, respectively.

For instance, although the key 107 to set the magnification is the up key of the magnification, the key 107 has two key input contacts of ↑1 and ↑2 as shown in FIG. 7. The contact of ↑1 is closed when the key 107 is lightly depressed. The contact of ↑2 is also closed together with the contact ↑1 when the key 107 is further depressed by a strong depression force. For instance, such a structure can be realized in a manner such that a key top is urged and supported by a spring and both of the contacts are arranged so as to come into contact with different positions of a depression key stroke, respectively.

As mentioned above, the depression force of the key 107 can be detected by at least two stages. The CPU 301 can detect not only the presence or absence of the depression of the key 107 but also the depression force of the key 107 through the I/O port 303 of the key and the CPU bus 302.

Each of the keys 108, 110, and 111 also has a structure similar to the key 107 mentioned above. It is now assumed that the key 108 has the two contacts of ↓1 and ↓2, the key 110 has the two contacts of →1 and →2, and the key 111 has the two contacts of ←1 and ←2, respectively. Each of the above contacts has a function similar to that of the key 107 mentioned above.

Figure 8A:
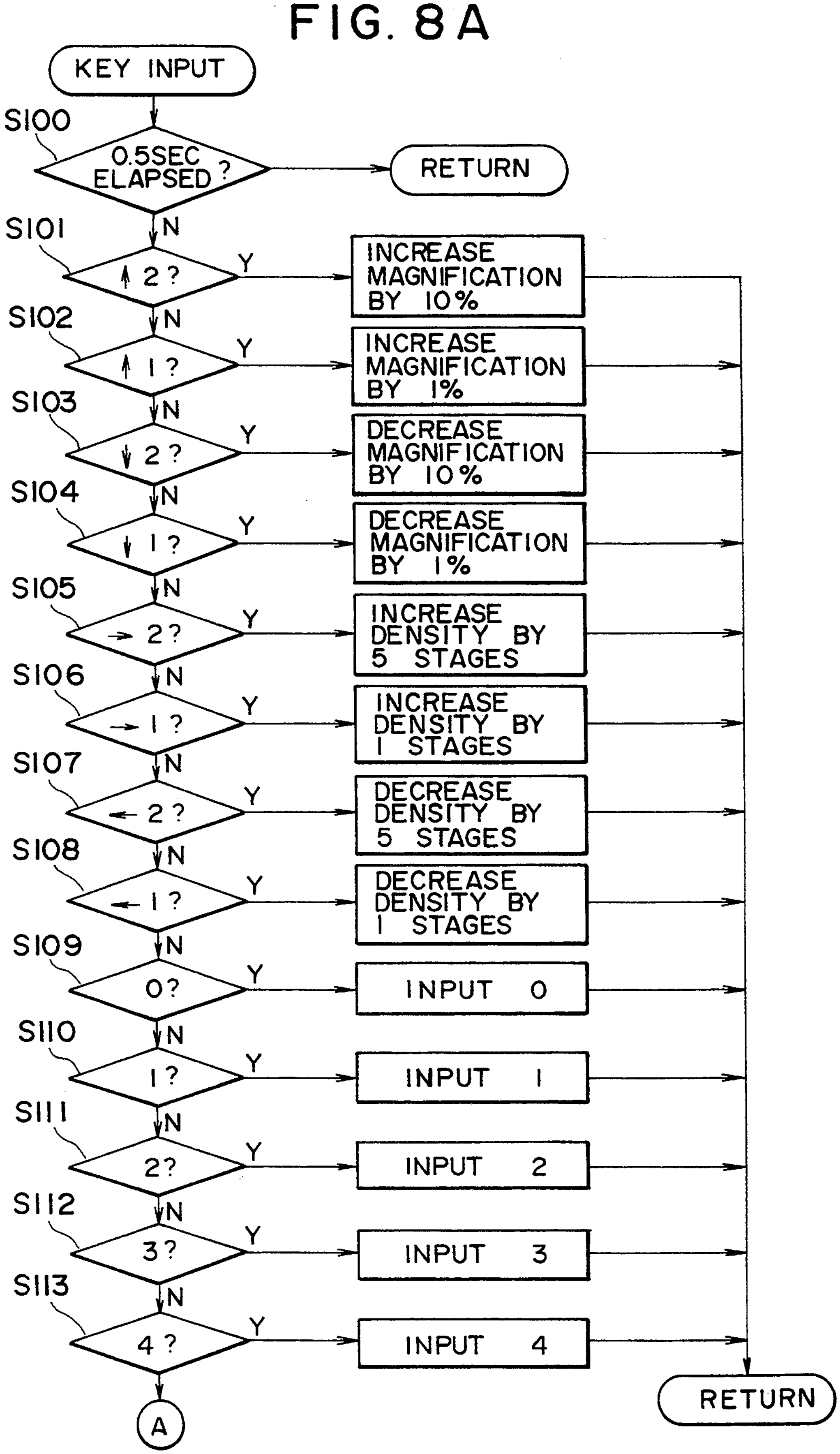
FIGS. 8A and 8B are flowcharts showing control procedures of a CPU in FIG. 7.
Figure 8B:
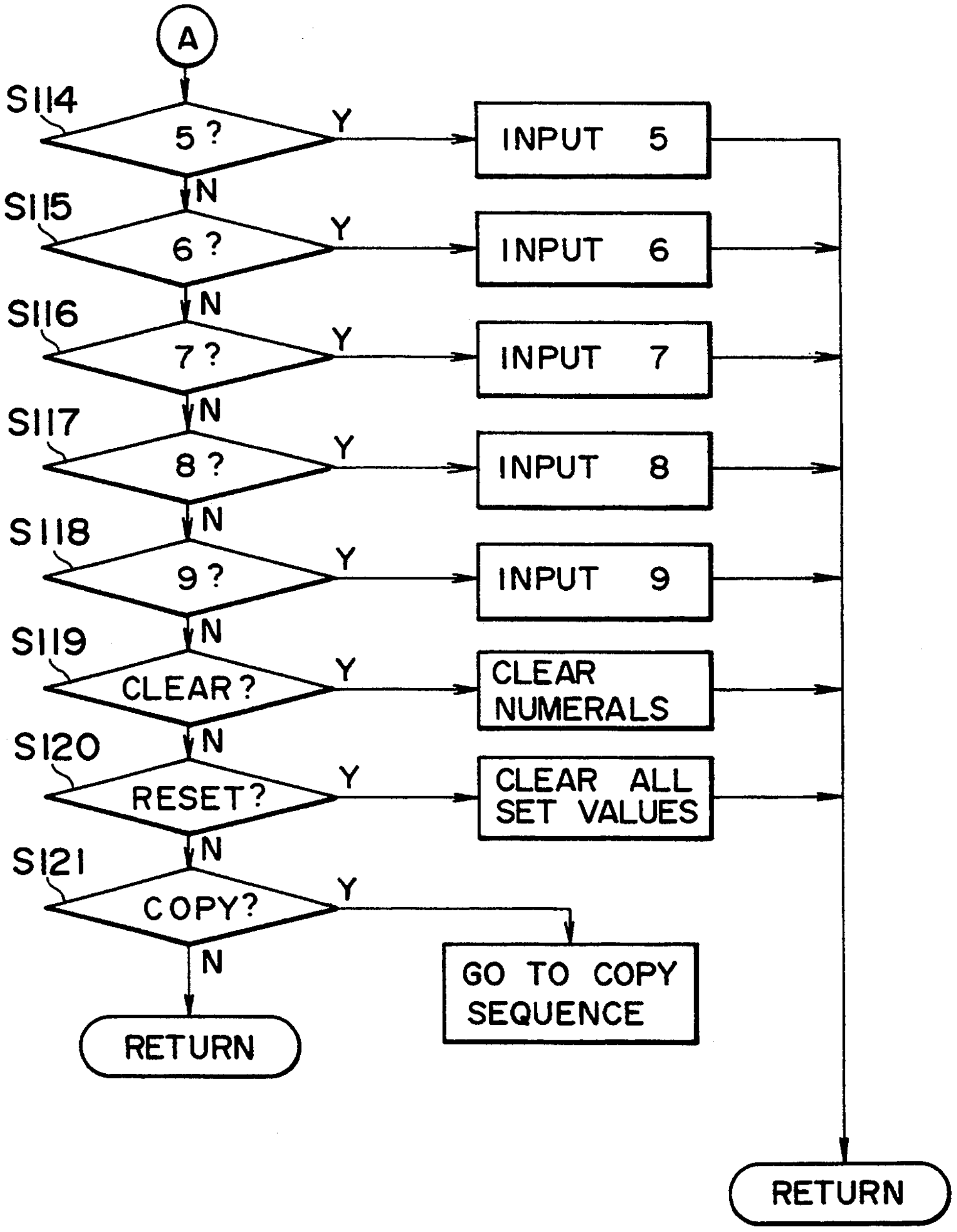

The input control using the keys 107, 108, 110, and 111 constructed as mentioned above will now be described hereinbelow with reference to FIGS. 8A and 8B. FIGS. 8A and 8B show control procedures of the CPU 301 in FIG. 7. The control procedures shown in the diagrams have been stored in the ROM 305 as key input control programs of the CPU 301. In FIGS. 8A and 8B, blocks on the right side in steps S101 to S121 denote the operations which are executed as a result of YES in each discriminating step.

Step S100 relates to a timer discrimination to execute a periodic key operation. In step S100, a check is made to see if 0.5 second has elapsed from the preceding key input control or not. If NO, no key input is accepted. If YES, the content of the key depressed is discriminated in the processing routine in step S101 and subsequent steps.

If a target magnification is larger than the present magnification, the magnification is changed to a target value by depressing the up key 107. When the key 107 is lightly depressed, the contact of ↑1 is closed, so that the magnification is increased by 1% on the basis of the result of the judgment in step S102. If the key 107 is continuously lightly depressed, accordingly, the magnification is increased on a 1% unit basis every 0.5 second.

On the other hand, when the key 107 is strongly depressed, the contact of ↑2 is closed, so that the magnification is increased by 10% on the basis of the judgment in step S101. If the key 107 is continuously strongly depressed, therefore, the magnification is increased on a 10% unit basis every 0.5 second.

Consequently, the operator who sets the magnification confirms the displayed content about the magnification, and by strongly depressing the key 107 when the present magnification is largely away from the target value and by lightly pressing the key 107 when the magnification approaches the target value, the displayed magnification numeral slowly changes, so that the operator can easily accurately set the magnification to the target value.

On the contrary, when the target magnification is smaller than the present magnification, the magnification is changed to the target value by depressing the down key 108 in a manner similar to the above case.

When the key 108 is lightly pressed, the contact of ↓1 is closed and the magnification is decreased by 1% due to the judgment in step S104. Therefore, if the key 108 is continuously lightly pressed, the magnification is reduced on a 1% unit basis every 0.5 seconds.

On the other hand, when the key 108 is strongly depressed, the contact of ↓2 is closed and the magnification is reduced by 10% due to the judgment in step S103. If the key 108 is continuously strongly depressed, therefore, the magnification is decreased on a 10% unit basis every 0.5 seconds.

Thus, the operator who sets the magnification confirms the displayed content, and by strongly depressing the key 108 when the present magnification is largely away from the target value and by lightly pressing the key 108 when the magnification approaches the target value, the displayed magnification numerals are slowly changed. Consequently, the operator can easily accurately set the magnification to the target value.

In a manner similar to the magnification changing process, the input control of the keys 110 and 111 to set the density is also similarly executed. The input control upon setting of the density will now be described hereinbelow with reference to FIGS. 8A and 8B.

If the target density is larger than the present density, the density is changed to the target value by pressing the density up key 110. When the key 110 is lightly pressed, the contact of →1 is closed and the density is increased by one stage due to the judgment in step S106.

If the key 110 is continuously lightly pressed, the density is increased by one stage at a time every 0.5 second. When the key 110 is subsequently strongly depressed, the contact of →2 is closed and the density is increased by 5 stages due to the judgment in step S105. If the key 110 is continuously strongly depressed, therefore, the density is increased by 5 stages at a time every 0.5 seconds.

Accordingly, the operator who sets the density confirms the displayed content of the density, and by strongly depressing the key 110 when the present density is largely away from the target value and by lightly pressing the key 110 when the density approaches the target value, the displayed density numerals are slowly changed. Thus, the operator can easily accurately set the density to the target value.

On the contrary, if the target density is smaller than the present density, by pressing the density down key 111, the density is changed to the target value in a manner similar to the above.

When the key 111 is lightly pressed, the contact of ←1 is closed and the density is decreased by one stage due to the judgment in step S108. If the key 111 is continuously lightly pressed, therefore, the density is reduced by one stage at a time every 0.5 seconds.

On the contrary, when the key 111 is strongly depressed, the contact of ←2 is closed and the density is decreased by 5 stages due to the judgment in step S107. If the key 111 is continuously strongly depressed, accordingly, the density is reduced by 5 stages at a time every 0.5 seconds.

Thus, to set the density the operator confirms the displayed content of the density, and by strongly depressing the key 111 if the present density is largely away from the target value and by subsequently lightly pressing the key 111 when the density approaches the target value, the displayed density numeral is slowly changed. Thus, the operator can easily accurately set the density to the target value.

In FIGS. 8A and 8B, steps S109 to S118 relate to a processing routine to directly input numerals by using the ten-key 105. Step S119 relates to a processing routine to clear the input numerals just before the clearing operation. Step S120 relates to a processing routine to clear all of the set values. Step S121 relates to a processing routine to specify all of the set values and to start the copy sequence.

According to the above construction, the depression force of the up or down key is detected and a changing speed of the numerals which are input is controlled in accordance with the detected depression force (the changing speed is increased when the depression force is strong and the changing speed is decreased when the depression force is weak). Therefore, as compared with the conventional construction such that the changing speed of the input numerals is controlled in accordance with the continuous depression time, there are excellent effects such that the operation is easy, the apparatus can also easily cope with a change in display content, and desired numerals regarding the zoom magnification and density and the like of the copying apparatus can be easily rapidly set.

Although the changing speed has been set to two stages in the above embodiment, it is possible to more finely control by setting the number of changing speeds to more number of stages such as three stages, four stages, or the like. In such a case, the will and feeling of the operator are reflected to a change in numerals.

Although the speed change has been controlled step by step, it is also possible to construct in a manner such that a pressure sensor is arranged under the key, a pressure detected by the pressure sensor is A/D converted into the digital signal, the digital signal is supplied to the CPU 301, and the changing speeds of numerals is controlled in accordance with the depression pressure of the key. In the above case, the speed change can be more finely controlled and the will and feeling of the operator can be reflected to a change in numerals.

Although depression type keys have been used as up/down keys in the above embodiment, the invention can be also accomplished by a type such that a lever having a shape like a small handle of an automobile or the like is rotated.

In such a case, there is considered a control method whereby, for instance, the input numerals are increased by rotating the lever clockwise, an increasing speed rises as the lever is further rotated clockwise, the input numerals are decreased by rotating the lever counterclockwise, and the decreasing speed rises as the lever is further rotated counterclockwise.

The above volume lever can be constructed so as to be automatically returned to the center position like a handle. When the volume lever is located at the center position, no data is input. Return springs are provided for the volume lever so that a rotating force increases when the lever is rotated clockwise or counterclockwise more and more.

In the above structure using the lever, the up/down keys have been realized by the same single key. The up/down inputting operations, however, can be also realized by independent volumes. In such a case, there is considered a control method whereby a changing speed of the magnification or the like rises as each of the up and down volumes is rotated clockwise more and more.

As will be obviously understood from the above modification, the construction to control the changing speed of the numerals in accordance with the depression force is not particularly limited to the type in which the key is depressed but can be also widely applied to the case where the numeral changing speed is controlled in accordance with an operating force of a device which is operated by rotation, tension, or the like.

The construction to detect such an operating force is not limited to multiple contacts or a pressure sensor but various detecting mechanisms which can be obtained by those skilled in the art can be used.

Further, even in the combination of the magnitude of the operating force and the numeral changing speed, the invention is not limited to the construction of a combination such that the changing speed is set to a high speed when the operating force is large and that the changing speed is set to a low speed when the operating force is small. A combination opposite to the above combination can be also used.

Although the embodiment has been described with respect to the example in which the magnification and the density of the copying apparatus are changed, the invention can be applied to all of the cases where desired numerals are selected from among a number of numerals by using the up/down keys.

That is, the invention can be applied to all of the cases where the number of copies is set, area data to execute an edition or the like is input, operating condition of the copying apparatus are input in a special mode by a service person, and addresses to confirm the operating mode of the copying apparatus are input by using the up/down keys by a service person.

The above construction can be, further, obviously embodied as a user interface other than the copying apparatus.

That is, the invention can be also applied to the cases of the movement of a cursor on a display, the setting of a time of a clock, the retrieval in an electronic dictionary, and the like in, for instance, word processors or personal computers.

Although the present invention has been described with respect to the preferred embodiments, the invention is not limited to the foregoing embodiments but many modifications and variations are possible within the spirit and scope of the appended claims of the invention.

We claim:

1. A numeral changing apparatus, comprising:

an operating member; and changing means for changing numerals in first predetermined numerical increments of one-by-one when a magnitude of force applied to said operating member is within a predetermined range, and changing the numerals in second predetermined numerical increments larger than the first predetermined numerical increments when the magnitude of force is larger than the predetermined range.

2. An apparatus according to claim 1, wherein said changing means changes the numerals by first predetermined increments of "1" when the magnitude of the force is within the predetermined range, and changes the numerals by second predetermined increments greater than "1" when the magnitude of the force is larger than the predetermined range.

3. An apparatus according to claim 1, further comprising a plurality of contacts, wherein a contact to be closed in the case when the magnitude of force within the predetermined range is applied is different from a contact to be closed when the magnitude of force larger than the predetermined range is applied, and said changing means changes the predetermined increments in accordance with the closed state of the plurality of said contacts.

4. An apparatus according to claim 1, wherein said changing means changes the numerals in first predetermined increments even if the magnitude of the force has any value included in the predetermined range.

5. An image forming apparatus, comprising:

an operating member; and changing means for changing numerals regarding image formation in first predetermined numerical increments of one-by-one when a magnitude of force applied to said operating member is within a predetermined range, and changing the numerals in second predetermined numerical increments larger than the first predetermined numerical increments when the magnitude of force is larger than the predetermined range.

6. An apparatus according to claim 5, wherein said changing means changes the numerals by first predetermined increments of "1" when the magnitude of the force is within the predetermined range, and changes the numerals by second predetermined increments greater than "1" when the magnitude of the force is larger than the predetermined range.

7. An apparatus according to claim 5, wherein said changing means changes the numerals in first predetermined increments even if the magnitude of the force has any value included in the predetermined range.

8. An image forming apparatus, comprising:

an operating member;

first and second contacts which are closed to correspond to first and second magnitudes of displacement increments of said operating member; and setting means for setting numerals regarding image formation corresponding to whether said first and second contacts are closed, wherein said setting means changes numerals in first predetermined numerical increments of one-by-one when said first contact is closed, and changes the numerals in second predetermined numerical increments larger than the first predetermined numerical increments when said second contact is closed.

9. An apparatus according to claim 8, wherein said setting means changes the numerals in accordance with first predetermined increments when said first contact is closed, and changes the numerals in second predetermined increments larger than the first predetermined increments when said first and second contacts are closed, wherein the first predetermined increment includes a minimum changing quantity which is changeable by said operating member.

10. An apparatus according to claim 8, wherein a first magnitude of the displacement closes said first contact, and said first magnitude is smaller than a second magnitude of the displacement for closing said second contact.

11. An apparatus according to claim 8, wherein said setting means changes the numerals by first predetermined increments of "1" when said first contact is closed, and changes the numerals by second predetermined increments greater than "1" when said first contact is closed and said second contact is closed.

12. A numeral changing apparatus, comprising:

an operating member for changing numerals having a plurality of values; and changing means for changing the numerals by first predetermined increments of "1" when a magnitude of force applied to said operating member is within a predetermined range, and changing the numerals in second predetermined increments greater than "1" when the magnitude of force is larger than the predetermined range.

13. An apparatus according to claim 12, further comprising a plurality of contacts, wherein a contact which is closed when the magnitude of force within the predetermined range is applied to said operating member is different from a contact which is closed when the magnitude of force larger than the predetermined range is applied, and said changing means changes the numerals in accordance with the closed state of the plurality of said contacts.

* * * * *

UNITED STATES PATENT AND TRADEMARK OFFICE
CERTIFICATE OF CORRECTION

PATENT NO. : 5,396,235

DATED : March 7, 1995

INVENTOR(S) : Maeshima et al.

It is certified that error appears in the above-indentified patent and that said Letters Patent is hereby corrected as shown below:

COLUMN 5:

Line 9, "an-image" should read --an image--.

COLUMN 8:

Line 4, "speeds" should read --speed--.

Signed and Sealed this

Twenty-fifth Day of July, 1995

Attest:

BRUCE LEHMAN

*Attesting Officer* *Commissioner of Patents and Trademarks*